(12) United States Patent
Wang et al.

(10) Patent No.: US 7,270,762 B2
(45) Date of Patent: Sep. 18, 2007

(54) POLISHING COMPOSITIONS FOR NOBLE METALS

(75) Inventors: Hongyu Wang, Wilmington, DE (US); Terence M. Thomas, Newark, DE (US); Qianqiu Ye, Wilmington, DE (US); Heinz F. Reinhardt, Chadds Ford, PA (US); Vikas Sachan, Richardson, TX (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 461 days.

(21) Appl. No.: 10/393,071

(22) Filed: Mar. 20, 2003

(65) Prior Publication Data

US 2003/0176072 A1    Sep. 18, 2003

Related U.S. Application Data

(60) Division of application No. 09/883,472, filed on Jun. 18, 2001, now abandoned, which is a continuation-in-part of application No. 09/734,087, filed on Dec. 11, 2000, now abandoned.

(60) Provisional application No. 60/171,553, filed on Dec. 22, 1999, provisional application No. 60/170,612, filed on Dec. 14, 1999.

(51) Int. Cl.
    *H01L 21/302*      (2006.01)
(52) U.S. Cl. .......................... 216/88; 216/89; 216/100; 438/692; 438/693; 438/754
(58) Field of Classification Search ..................... None
See application file for complete search history.

(56) References Cited

U.S. PATENT DOCUMENTS

| | | | | |
|---|---|---|---|---|
| 724,108 A | * | 3/1903 | Kendall ..................... | 106/1.05 |
| 4,956,015 A | * | 9/1990 | Okajima et al. ................ | 106/3 |
| 5,637,028 A | * | 6/1997 | Haisma et al. ................. | 451/36 |
| 5,795,828 A | * | 8/1998 | Endo et al. .................. | 438/678 |
| 6,140,234 A | * | 10/2000 | Uzoh et al. .................. | 438/678 |
| 6,293,848 B1 | * | 9/2001 | Fang et al. ................... | 451/36 |
| 6,342,166 B1 | * | 1/2002 | Ide et al. ..................... | 216/84 |

FOREIGN PATENT DOCUMENTS

RU          2089587 C1 * 9/1997

* cited by examiner

*Primary Examiner*—Anita Alanko
(74) *Attorney, Agent, or Firm*—Gerald K. Kita; Blake T. Biederman

(57) ABSTRACT

The polishing composition of this invention is useful for chemical-mechanical polishing of substrates containing noble metals such as platinum and comprises up to about 50% by weight of a adjuvant wherein said adjuvant is s elected from a group consisting of a metal-anion compound, a metal-cation compound or mixtures thereof; abrasive particles at about 0.5% to about 55% by weight of the polishing composition; and water-soluble organic additives up to about 10% by weight of the polishing composition. The abrasive particles are selected from the group consisting of alumina, ceria, silica, diamond, germania, zirconia, silicon carbide, boron nitride, boron carbide or mixtures thereof. The organic additives generally improve dispersion of the abrasive particles and also enhance metal removal rates and selectivity for metal removal by stabilizing the pH of the polishing composition and suppressing the dielectric removal rate.

10 Claims, 1 Drawing Sheet

POLISHING COMPOSITIONS FOR NOBLE METALS

Figure 1:
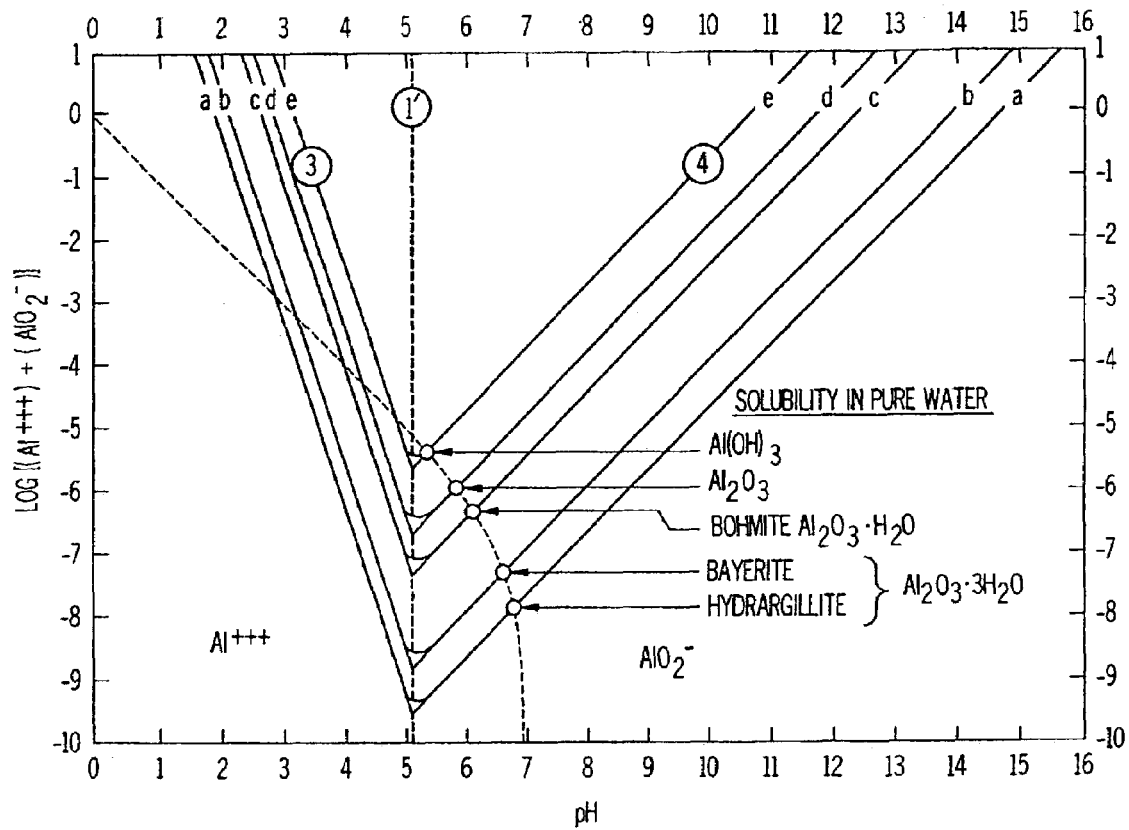

This utility application is a division of U.S. application Ser. No. 09/883,472 filed Jun. 18, 2001, now abandoned, which is a continuation-in-part of U.S. application Ser. No. 09/734,087 filed Dec. 11, 2000, now abandoned. U.S. application Ser. No. 09/734,087 claims the benefit of U.S. Provisional Patent Application No. 60/170,612 filed Dec. 14, 1999 and U.S. Provisional Patent Application No. 60/171,553 filed Dec. 22, 1999.

The present invention is directed to polishing compositions for polishing semiconductor or similar-type substrates. More particularly, the compositions of the present invention comprise a noble metal adjuvant for improved polishing performance.

Matsumoto et al, U.S. Pat. No. 5,492,855, issued Feb. 20, 1996, teaches sulfur-containing gases useful for dry etching of platinum.

According to the present invention, an adjuvant comprising a metal-anion compound, a metal-cation compound or mixtures thereof is provided in an aqueous polishing composition for chemical-mechanical polishing of a semiconductor substrate. The present invention is particularly useful for semiconductor substrates having a noble metal layer, a barrier layer, and a dielectric layer.

Embodiments of the invention will now be described by way of example with reference to the accompanying drawings.

FIG. 1 is a solubility diagram for solid alumina.

The use of noble metals in semiconductors is gaining more interest since noble metals are often used as electrodes and barrier materials in Gigabit DRAMs (dynamic random access memory) and FeRAMs (ferroelectric random access memory).

Integrated circuits are generally constructed by depositing successive layers of materials (metal, barrier and dielectric layers) on a wafer made of silicon. After each layer is deposited, the layer is typically etched to create circuitry features on the semiconductor substrate that act as components of integrated circuits. Due to miniaturization of lines and features in the device circuitry, it can be extremely difficult to achieve the correct depth of focus and establish an optimized process for photolithography that will compensate for within-die and die-to-die effects associated with non-planar surfaces. Furthermore, as a series of layers are sequentially deposited and etched, the outermost surface of the substrate, can become increasingly non-planar. Nonplanar surfaces on the wafer typically result in defects in subsequent circuit layers leading to flawed circuitry. It is thus desirable to have a planar surface on each of the successive layers.

In a typical chemical-mechanical planarization ("CMP") process for metal, if the entire planarization step were to take place in one step of polishing, it would generally be desirable to have high removal rates of material for the metal and barrier layers, while having low removal rates for the dielectric layer. The ratio of metal removal rate to dielectric removal rate is termed the metal selectivity ratio. To make the metal CMP process effective for metal removal, it is desirable to keep this ratio as high as possible.

The polishing composition according to this invention often yields substantially planar polished surfaces with a root mean square surface roughness, RMS, values less than 10 Angstroms and minimal defects. It is common practice to use a single number (an "RMS" number) to characterize surface roughness. RMS is the root mean square deviation of the polished substrate surface from the average amplitude/height of the substrate surface features.

The term "up to" as used herein is intended to include zero as a lower limit and to further include the identified value as an approximate upper limit (and all values in between), i.e., "up to about X," means values in a continuous range including 0 up to a value which may not be precisely X but which would be deemed sufficiently close to X as a practical matter to those skilled in the art, depending upon the particular embodiment or end use under consideration. Additionally, all percentages are on a weight basis unless otherwise specified.

The present invention is directed to a polishing composition or slurry for polishing a semiconductor substrate, particularly such a substrate comprising: i) one or more noble metals (e.g. platinum), and/or noble metal alloys; ii) an associated barrier layer (e.g. tantalum, tantalum nitride, titanium and/or titanium nitride); and iii) an associated dielectric layer (e.g. thermal oxide or silicon dioxide derived from tetraethyl orthosilicate (TEOS)) for the manufacture of an integrated circuit. A method for polishing a surface comprising noble metals is also provided. Noble metals as used herein are intended to include the platinum group elements (iridium, palladium, platinum, osmium, rhodium, and ruthenium), silver, gold, oxides and/or alloys thereof. Polishing compositions, as used herein are intended to include abrasive-free polishing compositions and abrasive-containing slurries which are polishing compositions containing abrasives. In an embodiment, this invention applies to the manufacture of semiconductor devices with noble metal interconnects. In another embodiment, this invention applies to the manufacture of capacitors in integrated circuits.

In an embodiment, the polishing composition comprises: substantially deionized water optionally with abrasive particles (e.g. alumina or ceria), along with other additives, such as, dispersants (to keep the abrasive particles in suspension), pH stabilizers (buffers) and other chemicals to enhance the activity of the polishing composition, such as, for attaining higher selectivity for removal of the target metal layer (e.g. platinum). In an embodiment, the polishing composition contains: i) water-soluble organic additives up to about 10% by weight of the polishing composition; ii) submicron-sized abrasive particles at a concentration of about 0.5% to about 55% by weight of the polishing composition; iii) and an adjuvant compound up to about 50% by weight of the polishing composition. The polishing composition provides a selectivity of greater than 1:1 between a metal layer and a dielectric layer or between a metal layer and a barrier layer of a semiconductor substrate.

In an embodiment, the adjuvant is a ligand-containing compound which forms a complex with the noble metal in the substrate being polished, said complex having a stability constant in a range of about 5 to about 100. In an alternative embodiment, the ligand-containing compound comprises a metal-anion compound, a metal-cation compound or mixtures thereof.

In an embodiment, the adjuvant is a water-soluble metal compound up to about 50% by weight of the polishing composition wherein the metal compound is a salt of bismuth, zinc, gallium or similar-type metal.

In an embodiment, the polishing composition comprises a mixture of adjuvants, wherein one adjuvant is a water-soluble metal compound up to about 50% by weight of the polishing composition, the metal compound being a salt of bismuth, zinc, gallium or similar-type metal and the second adjuvant is a ligand-containing compound, up to about 50% by weight of the polishing composition, which forms a complex with the noble metal in the substrate, said complex preferably having a stability constant in a range of about 5 to about 100.

The water-soluble organic additives of the present invention preferably contain a polar moeity such as hydroxy, carboxy, thiol, mercapto, amino and the like and are generally used to: i) modify the viscosity of the polishing composition; ii) to disperse the abrasive particles in the polishing composition; and/or iii) stabilize the pH of the polishing composition by acting as a pH buffer. Optionally, the organic compound is an organic acid selected from the group consisting of dicarboxylic acids, tricarboxylic acids and hydroxy acids. Examples of water-soluble organic additives containing carboxy moieties include ammonium hydrogen phthalate and potassium phthalate. An organic compound such as polyvinyl pyrrolidone can be used to modify the viscosity of the polishing composition of this invention.

In an embodiment, abrasive particles comprise between 0.5% to 55% by weight of the polishing composition, depending on the degree of abrasion required. The abrasive particles can be primary particles having a mean size range of 25 to 500 nanometer (nm) or a mixture of primary particles and agglomerated smaller particles having a mean aggregate size up to 500 nm (primary particle size range of 5 to 100 nm). In an embodiment, the polishing composition has abrasive particles in a mean size range of 5 to 100 nm and the abrasive particles are made of a material having a hardness of about 4 mohs to about 10 mohs. The abrasive particles and agglomerates may be encapsulated while maintaining the hardness, so that the polished substrate has minimal scratches and defects.

Abrasive particles in the polishing composition include but are not limited to alumina, ceria, germania, silica, titania, zirconia diamond, silicon carbide, boron carbide, boron nitride, or combinations thereof. In an embodiment, the polishing composition contains about 99% alpha-alumina. Commercially, alumina is available as alpha-alumina, gamma-alumina and delta-alumina. These phases result from various steps in the dehydration sequence of hydrated aluminum oxide. Alpha-alumina is harder than gamma-alumina and is preferred for the removal of harder substrates such as tungsten and platinum. The hardness of alumina is dependent upon the weight percent of alpha-alumina. Thus, the surface finish of substrates is controlled via the use of alumina with different weight percentages of alpha-alumina. More details about the use of alpha-alumina in slurries is found in U.S. Pat. No. 5,693,239.

In an embodiment, the polishing composition has abrasive particles with a surface area of about 50 to 400 $m^2/g$ and a mean aggregate size less than 500 nm. For example, assuming the density of alumina to be 3.96 gm/cc, the theoretical surface area corresponding to a 1 nm diameter spherical particle is about 1,500 $m^2/gm$; the theoretical surface area corresponding to a 10 nm diameter spherical particle is about 150 $m^2/gm$; and the theoretical surface area corresponding to a 500 nm diameter spherical particle is about 3 $m^2/gm$. The actual surface area of the abrasive particles can be measured by the nitrogen adsorption method of S. Brunauer, P. H. Emmet and I. Teller, J. Am. Chemical Society, Volume 60, page 309 (1938) which is commonly referred to as BET measurement. Actual surface area of the abrasive particles is a function of the abrasive particle size distribution (whether monomodal or bimodal) and abrasive particle porosity. The abrasive particle size distribution can be unimodal, bimodal or multi-modal. A unimodal (also referred to as monomodal) particle size distribution has relatively uniformly sized particles whereas a bimodal population contains particles grouped into two distinct populations by particle diameter. Mean particle diameter is typically reported as the particle size for commercially available abrasive materials.

The particles in the polishing composition should be dispersed, and not settle or agglomerate. However, it is understood that depending on the percentages of the primary particles and agglomerated particles, such particles in the polishing composition may settle and require redispersion by mechanical means such as mixing. High shear mixing is employed for the purpose of redispersion.

An organic compound is used as the dispersion agent. The dispersion agent reduces the tendency of the abrasive particles in the polishing composition to adhere to the substrate surface during post-polishing cleaning. In order to further stabilize the slurry against settling, flocculation and agglomeration, a variety of other additives can also be used such as surfactants, polymeric stabilizers, or other surface active dispersing agents. Many examples of typical surfactants are found in McCutcheon's Emulsifiers and Detergents, North American and International Edition (McCutcheon Division, The MC Publishing Co, April 2000). The surfactant or dispersion agent is generally added to the polishing composition in an amount to achieve steric stabilization of the abrasive particles.

A stable polishing composition is one in which the zeta potential is greater than +20 millivolts or less than −20 millivolts. Zeta Potential is the potential difference, measured in a liquid, between the shear plane and the bulk of the liquid beyond the limits of the electrical double layer. The zeta potential of the polishing composition is dependent on the pH, type of abrasive (metal oxide) present and the presence of surfactants, salts etc. As the pH is increased, the surface charge increases negatively or positively away from the isoelectric point, until it reaches a maximum value. The isoelectric point being defined as the pH at which the zeta potential is zero. Zeta potential is measured by several standard techniques based such as electrophoresis and electroacoustic spectroscopy (an interaction of electric and acoustic fields). One can apply a sound field and measure the resultant electric field which is referred to as the colloid vibration potential (CVP), or conversely one can apply an electric field and measure the resultant acoustic field which is referred to as the electronic sonic amplitude (ESA). A typical zeta potential measuring tool is similar to the Acoustic and Electroacoustic Spectrometer, Model DT-1200, manufactured by Dispersion Technology, Inc. Mount Kiso, Ky.

Sulfur-containing compounds are used in an embodiment of the polishing composition to enhance the removal of the noble metal present in the substrate being polished. By way of example, an enhanced removal mechanism includes, adsorption of the sulfur-containing compounds onto the noble metal layer in the substrate surface followed by mechanical removal aided by the repetitive motion and friction of the substrate surface against the polishing pad, further aided by an abrasive in the polishing composition. At the interface of the substrate surface and the surrounding polishing composition, the surface noble metal atoms generally have empty "d" or "s" orbitals that are electron deficient thus enabling complexation with compounds that act as lewis bases or contain lewis-base moieties. Stability constant refers to the equilibrium reaction between the metal cation and the ligand (lewis-base) to form a chelating complex.

A ligand-containing compound contains a molecule, ion or atom that is attached to the central atom of a coordination compound, a chelate, or other complex as described in Hawley's Condensed Chemical Dictionary, 13$^{th}$ Edition, Page 670, John Wiley and Sons, Inc., 1997, ISBN: 0-471-29205-2. In an embodiment, the adjuvant is a ligand-containing compound that comprises a metal-anion compound, a metal-cation compound or mixtures thereof. In an alternative embodiment, the adjuvant is a salt of an isopoly acid of a metal or a salt of a heteropoly acid of a metal. In an embodiment, the adjuvant is a salt of bismuth, zinc, gallium or a similar-type metal ion having an ionic radius or chemical reactivity similar to bismuth, zinc, or gallium. Metals such as bismuth, zinc and gallium are known to corrode platinum as described in "Fundamentals of Analytical Chemistry," Douglas A. Skoog and Donald M. West, 2$^{nd}$ Edition, Chapter 23, Page 518, Holt, Rinehart and Winston, Inc., 1969, ISBN: 0-03-075390-2.

Exemplary ligands and corresponding stability constants for some metals are listed in the following table.

| Metal Ion (1) | Ligand | Stability Constant (2) |
|---|---|---|
| Platinum(+2) | Chloride ion | 14 (25° C., 1.0) |
| | Thiosulfate ion | 43.7 (25° C., 0.5) |
| Palladium(+2) | Chloride ion | 9.5 (25° C., 0.5) |
| | Thiosulfate ion | 35 (25° C., 0.5) |
| Aluminum(+3) | Citrate ion | 11.7 (25° C., 0.5) |

Notes:
(1) The oxidation state of the metal ion is indicated within parentheses.
(2) The stability constant values are derived from the National Institute of Standards and Technology (NIST) Critically Selected Stability Constants of Metal Complexes, Database Version 5.0, September 1998. The temperature of measurement and the ionic strength are indicated within parentheses.

The high stability constant for the noble metal (for example: platinum) and thiosulfate enhances the dissolution rate of the noble metal from the substrate surface, thereby increasing the noble metal removal rates during CMP.

Either inorganic and/or organic compounds or both containing sulfur are used in an embodiment of the polishing composition to enhance removal of the noble metal present in the substrate. In an embodiment, the polishing composition contains up to about 50% by weight of an inorganic or organic sulfur-containing compound.

Optionally, the organic sulfur-containing compound is selected from the group consisting of aromatic sulfide, aromatic sulfoxide, amino alkyl thiols, alkyl mercaptans, mercaptocarboxylate esters, thioglycolic acid, mercaptoalanines, mercaptoaromatic acids, mercaptoaromatic thiazoles, mercaptoaromatic thiazyl disulfides, mercaptoalkanols, mercaptoalkyl amine hydrochlorides. mercaptoalkyl aromatic sulfonamides, mercaptopropionic acid and mercapto succinic acid. Examples of an organic "sulfur-containing" compound that are used in the polishing composition of this invention include but are not limited to amino alkane thiols such as 2-aminoethane thiol; alkyl mercaptans such as tert-dodecyl mercaptan, and mixtures of C10-C11 tertiary mercaptans; mercaptocarboxylate esters of polyols such as ethylene glycol his (thioglycolate), ethylene glycol bis (mercatopropionate), trimethylolpropane tris (thioglycolate), trimethylolpropane tris(mercaptopropionate), pentaerythritol tetrakis(thioglycolate), pentaerythritol tetrakis(mercapto-propionate); thioglycolic acid, beta-mercaptoalanine, 2-mer-captobenzoic acid, 2-mercaptobenzothiazole, 2-mercapto-benzothiazyl disulfide, mercaptoethanol, beta-mercaptoethylamine hydrochloride, N-(2-mercaptoethyl) benzene sulfonamide, 2-mercapto-4-hydroxypyrimidine, 2-mercaptoimidazoline, mercaptomerin sodium, beta-mercaptopropionic acid, 6-mercaptopurine, mercapto succinic acid, and 2-mercaptothiazoline; aromatic sulfides such as diphenyl sulfide; and aromatic sulfoxides such as diphenyl sulfoxide and the like.

Examples of an inorganic "sulfur-containing" compound in an embodiment of the polishing composition include metal salts of acids such as thiosulfuric acid, disulfurous acid, polythionic acid, peroxodisulfuric acid and combinations thereof.

In an embodiment of the polishing composition, an organic additive is used up to about 10% by weight, based on the weight of the polishing composition. The organic additive functions as an encapsulating, suspending means for the abrasive particles, to minimize scratching associated with the hard abrasive particles and to improve the overall uniformity of the substrate surface. Alternatively, the organic additive improves the surface quality of the semiconductor substrate being polished by adsorbing onto the target metal layer as well as protecting the dielectric and associated barrier layer during the polishing process. Another use of the organic additive is to act as a pH buffer to stabilize the pH of the polishing composition. Exemplary organic additives contain hydroxy, carboxy, thiol, mercapto, amino groups and include compounds such as phthalates for e.g. ammonium hydrogen phthalate and potassium phthalate. Further, exemplary organic additives with carboxy moieties include organic acids with carboxylate, hydroxyl, sulfonic and phosphonic groups. Examples of organic acids are citric acid, lactic acid, malic acid and tartaric acid. The use of acid species for suppression of the rate of removal of the dielectric layer is described in detail in U.S. Pat. No. 5,476,606 which is herein incorporated by reference.

Uniform removal rates are a function of the pH of the polishing composition. Thus, a polishing composition with a stable pH is desired. In an embodiment, the polishing composition has a pH in a range of about 1.5 to 5 and contains abrasive particles made of alpha-alumina and gamma alumina. It is found that the time to attain a stable equilibrium pH value is a function of the weight percent of alpha-alumina and gamma-alumina in the abrasive. Thus, in polishing compositions containing alpha-alumina and gamma-alumina in the abrasive, pH stability is ensured by the addition of aluminum ions at molar concentrations up to 10 M. In an embodiment, dissolved aluminum(III) ions are provided at an initial concentration of 1M to obtain a polishing composition with a stable pH value of about 2. The molar concentration of dissolved aluminum ions at a particular pH is determined from solubility diagrams of alumina at various pH values illustrated in the FIG. 1. FIG. 1 is derived from FIG. 4, in the Aluminum Section of the Atlas of Electrochemical Equilibria, Marcel Pourbaix, 1966. In another embodiment, an organic acid such as citric acid is added in concentrations up to 2M to obtain a polishing composition with a stable pH. A stable pH as defined herein is a pH value that fluctuates by less than 0.5 pH units.

As discussed herein, various physical, chemical and mechanical parameters control the quality of the polished substrate surface. Polishing pressure or downforce controls the rate of polishing. A higher downforce results in a faster polishing rate while a lower downforce yields a polished surface of better quality since the abrasive particles do not scratch the substrate surface to the same extent as at higher downforce values.

In CMP, the substrate (glass disk or semiconductor wafer) to be polished is generally mounted on a carrier or polishing head of the polishing apparatus. The exposed surface of the semiconductor substrate is generally placed against a rotating polishing pad. The surface of the polishing layer of the polishing pad that is in contact with the semiconductor device is generally referred to as the polishing layer. The polishing pad may be a known pad (without any abrasive in the polishing layer) also referred to herein as the non fixed-abrasive pad or a fixed-abrasive pad (containing abrasive in the polishing layer). The carrier head generally provides a controllable pressure (or downforce), on the substrate to push it against the polishing pad. A polishing composition with or without abrasive particles is then dispensed at the interface of the wafer and the polishing pad to enhance removal of the target layer (for e.g., metal in metal CMP processes).

The polishing composition is typically water based and may or may not require the presence of abrasive particles, depending on the composition of the polishing layer of the polishing pad. An abrasive-free polishing fluid also referred to as a reactive liquid is typically used with a fixed-abrasive pad while a polishing fluid containing abrasive particles is typically used with a non fixed-abrasive pad. For polishing softer metal interconnects, such as copper, the polishing fluid can contain up to 3% by weight of abrasive particles. Typical abrasive particles that are used in CMP polishing of semiconductors are alumina, ceria, silica, titania, germania, diamond, silicon carbide, boron carbide, boron nitride, or combinations thereof. The polishing composition of this invention contains abrasive particles at about 0.5% to 55% by weight of the polishing composition.

Polishing is generally effected by lateral motion of the substrate relative to the polishing pad. The motion may be linear or circular or a combination thereof. The polishing pad surface has an initial micro-texture that is regenerated during polishing use of the pad by mechanical means for forming micro-texture, mounted on the polishing apparatus. The mechanical means is typically a 100-grit conditioning disk supplied by Abrasive Technology, Inc. The micro-texture reconditioning step is preferably performed at intervals during the polishing process, either during the step of applying the substrate against the pad, or more preferably during intervals when the substrate is disengaged from the pad. A suitable polishing apparatus equipped with a means for re-conditioning the pad surface (to regenerate micro-texture) is disclosed in U.S. Pat. No. 5,990,010. Polishing is terminated when the substrate achieves the desired degree of flatness with the metal layer being completely removed. An example of a polishing pad that may be used is a urethane polishing pad with a closed-cell structure.

EXAMPLE 1

This example illustrates a significant improvement in the selectivity for platinum removal through the addition of thiosulfate ions to the polishing composition. The polishing experiment was performed on 200 mm wafers coated with platinum and silicon dioxide derived from TEOS using an IC1000-XY groove polishing pad, available from Rodel, Inc. (based in Newark, Del., USA), on a Strasbaugh 6DS-SP polishing machine. The IC1000-XY groove polishing pad was used along with a SUBA IV polishing pad as the sub-pad. SUBA IV polishing pads are also available from Rodel, Inc. Polishing was performed under the following conditions:

| | |
|---|---|
| Polishing downforce: | 4 psi |
| Platen speed: | 80 rpm |
| Carrier speed: | 60 rpm |
| Back pressure: | 0 psi |
| Slurry flow: | 200 ml/min |
| Polishing Duration: | 60 seconds. |

The IC1000-XY polishing pad was conditioned using two sweeps of a 4-inch, 100 grit diamond conditioner disc of the type available from Abrasive Technology, Inc. with constant flushing with deionized water. A platen speed of 50 rpm was utilized along with a downforce of 14 lbs during the conditioning cycle. The polished wafers were buffed utilizing a Politex brand pad (also available from Rodel, Inc.) and deionized water.

Different formulations of the polishing composition were prepared and used to polish the 200 mm wafers with platinum and silicon dioxide derived from TEOS. Table 1 presents platinum removal rate (RR) data and roughness values for the polished wafer surface for this experiment. All formulations of the polishing composition had a pH of 2. In addition, hydrochloric acid was added to each formulation at about 0.1% by weight of the formulation. The roughness values were measured using Digital Instruments Dimension 5000 Atomic Force Microscope utilizing a 20 micron by 20 micron scan area.

TABLE 1

| | Platinum Removal Rates (Å = Angstroms) | | | | | | |
|---|---|---|---|---|---|---|---|
| Slurry | Alpha-Alumina wt % | Citric Acid (wt %) | Sodium Thiosulfate (wt %) | Platinum RR (Å/min) | TEOS RR (Å/min) | Pt:TEOS Selectivity | RMS (nm) |
| Baseline | 1.0 | 0.00 | 0.00 | 713 | 29 | 24.4 | 0.96 |
| A1 | 1.0 | 0.00 | 0.00 | 648 | 27 | 24.3 | 0.88 |
| B1 | 1.0 | 0.00 | 0.1 | 1296 | 55 | 23.7 | 0.78 |
| C1 | 1.0 | 0.00 | 0.3 | 1560 | 79 | 19.7 | 0.77 |
| D1 | 2.0 | 0.00 | 0.2 | 1661 | 108 | 15.4 | 1.06 |
| E1 | 3.0 | 0.00 | 0.1 | 1469 | 47 | 31.6 | 0.94 |
| F1 | 3.0 | 0.0 | 0.3 | 1726 | 61 | 28.2 | 0.67 |
| G1 | 1.0 | 0.2 | 0.2 | 1447 | 36 | 39.9 | 0.56 |
| H1 | 2.0 | 0.2 | 0.2 | 1555 | 51 | 30.3 | 0.7 |

As indicated by data in Table 1, for a fixed abrasive concentration, platinum removal rate is increased by the addition of thiosulfate ions. In addition, increasing the weight percent of alumina for a fixed concentration of thiosulfate ions increases the platinum removal rate. For a fixed abrasive concentration, adding citric acid improves the selectivity for platinum removal due to a decrease in oxide rate.

EXAMPLE 2

200 mm wafers coated with platinum and silicon dioxide derived from TEOS were polished utilizing a Westech 372U polishing machine (available from IPEC/SPEEDFAM). All conditions were identical to those in Example 1, with the exception of downforce, which was changed to 4 psi. Different formulations of the polishing composition were prepared and used to polish the 200 mm wafers. Table 2 presents platinum removal rate data and roughness values for the polished wafer surface. All formulations of the polishing composition had a pH of 2. Surface Roughness values were measured using Digital Instruments Dimension 5000 Atomic Force Microsope utilizing a 20 micron by 20 micron scan area.

TABLE 2

Platinum Removal Rates (HCl = hydrochloric acid; Pt = Platinum; Å = Angstroms)

| Slurry | Alpha-Alumina wt % | Particle Size (nm) | HCl (wt %) | Citric Acid (wt %) | Pt RR (Å/min) | TEOS RR in (Å/min) | Pt:TEOS Selectivity | Ra (nm) |
|---|---|---|---|---|---|---|---|---|
| A2 | 1.0 | 190 | 0.037 | 0.0 | 666 | 28 | 23.8 | 0.95 |
| B2 | 1.0 | 190 | 0.037 | 0.0 | 672 | 34 | 19.8 | 0.80 |
| C2 | 1.0 | 190 | 0.1 | 0.2 | 616 | 42 | 14.7 | 0.91 |
| D2 | 1.0 | 190 | 0.3 | 0.2 | 585 | 37 | 15.7 | 0.73 |
| E2 | 2.0 | 250 | 0.0 | 0.0 | 568 | 16 | 36.4 | 0.43 |
| F2 | 4.0 | 250 | 0.0 | 0.0 | 560 | 15 | 38.1 | 0.27 |

As may be seen from Table 2, the selectivity for platinum removal was enhanced through the addition of higher weight percentages of alumina for a given particle size.

EXAMPLE 3

This example illustrates attainment of a stable pH value through the addition of aluminum ions and/or organic acids such as citric acid. A soluble aluminum salt such as aluminum chloride, aluminum citrate and/or aluminum nitrate can be used to provide aluminum ions. Aluminum chloride was used in this example. The following table illustrates the time to attain a stable pH (equilibrium) value in a range of about 3.7 to 4 for formulations of the polishing composition containing abrasives with varying weight percentages of alpha-alumina. The initial pH of each formulation of the polishing composition was 2.0 and the total abrasive concentration was held constant at 30 wt %.

TABLE 3

Time to attain a Stable pH

| Sample No. | Percent alpha-alumina | Percent gamma-alumina | Time to Attain Stable pH value (in days) |
|---|---|---|---|
| 1 | 0 | 100 | 1 |
| 2 | 75 | 25 | 9 |
| 3 | 99 | 1 | 37 |

A stable pH is obtained when a fixed dissolved concentration of Aluminum (III) ($Al^{3+}$) ions is present in solution. The fixed dissolved Aluminum (III) concentration corresponds to the equilibrium concentration, for a specified pH value, based upon the solubility of hydrated alumina. Equilibrium Al(III) ion concentration at a specific pH are obtained from a solubility diagram such as FIG. 1. As shown in FIG. 1, the final pH value in a range of about 3.7 to 4 corresponds to a dissolved aluminum concentration of 0.001M. Gamma-alumina dissolves faster than alpha-alumina, thus the time to attain a stable pH value is much shorter when the abrasive in the polishing composition contains only gamma-alumina. In contrast, the time to equilibrum when the abrasive comprises primarily alpha-alumina is much longer. By providing an initial fixed dissolved Aluminum (III) concentration in solution, a polishing composition with an immediately stable pH value is obtained.

Addition of an organic acid such as citric acid also stabilizes the pH of alumina slurries. Alumina particles dissolve until the dissolved aluminum (III) concentration in solution is the equilibrium value corresponding to a given pH value. The dissolution reaction causes hydroxyl ions to be released, according to the following reaction:

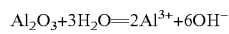

$$Al_2O_3 + 3H_2O = 2Al^{3+} + 6OH^-$$

When citric acid is present in the polishing composition in a proportionate amount, it complexes with the aluminum (III) ions. As a consequence of this complexation reaction, hydrogen ions are released, neutralizing the hydroxyl ions released by the above dissolution process, resulting in a stable pH.

EXAMPLE 4

This example illustrates enhanced metal removal rates obtained utilizing the polishing composition of this invention. A polishing composition containing 0 to 0.2% hydrochloric acid; 0 to 2% aluminum nitrate; 0 to 0.4% citric acid; 0 to 0.4% hydrated zinc sulfate ($ZnSO_4 \cdot 7H_2O$); 0 to 2% alumina; and a pH of 2.0 was utilized to polish test platinum wafers. The control platinum wafer was polished utilizing a polishing composition identical to the polishing composition utilized for polishing the test platinum wafer. All polishing tests were performed under conditions identical to those of Example 1.

TABLE 4

Platinum Removal Rate in the Presence of Metal Ions

| Sample Type | Pt Removal Rate | Metal Ion Added |
|---|---|---|
| Control | 28 Å/min | None |
| Test | 511 Å/min | Zinc |

As illustrated in Table 4 above, the addition of metal ions significantly enhances platinum removal rate from the substrate.

The above discussion is provided only for purposes of illustration and is not intended to limit the definition of the present invention, which is intended to be solely defined by the following claims.

What is claimed is:

1. A method for chemical-mechanical polishing a semiconductor substrate, the semiconductor substrate having a noble metal layer, a barrier layer, and a dielectric layer, the method including the step of:

polishing a platinum layer of the semiconductor substrate with an aqueous composition, the aqueous composition including thiosulfate or an adjuvant selected from salt of bismuth, zinc and gallium, the thiosulfate forming a complex Lewis-base ligand with a noble metal from the noble metal layer and the complex has a stability constant in a range of about 5 to about 100 and pH of the aqueous composition is in a range of about 1.5 to about 5.

2. The method of claim 1 wherein the polishing of the noble metal layer occurs with polishing a dielectric or barrier layer and the polishing has a selectivity of greater than 1:1 between the noble metal layer and the dielectric layer or the noble metal layer and the barrier layer of the semiconductor substrate.

3. The method of claim 1 wherein the polishing uses the polishing composition having abrasive particles present at a concentration from about 0.5% to about 55% by weight of the polishing composition; an organic compound up to about 10% by weight of the polishing composition; and the adjuvant up to about 50% by weight of the polishing composition.

4. The method of claim 3 wherein the polishing uses the adjuvant selected from the group consisting of salt of bismuth, zinc and gallium.

5. The method of claim 1 wherein the polishing uses the aqueous composition having an acid selected from the group consisting of citric acid, lactic acid, malic acid and tartaric acid.

6. A method for chemical-mechanical polishing a semiconductor substrate, the semiconductor substrate having a platinum metal layer, a barrier layer, and a dielectric layer, the method including the step of:

polishing the platinum metal layer of the semiconductor substrate with an aqueous composition, the aqueous composition including thiosulfate, the thiosulfate forming a complex Lewis-base ligand with platinum metal from the platinum metal layer and the complex has a stability constant in a range of about 5 to about 100 and pH of the aqueous composition is in a range of about 1.5 to about 5.

7. The method of claim 6 wherein the polishing the platinum metal layer occurs with polishing a dielectric or barrier layer and the polishing has a selectivity of greater than 1:1 between the platinum metal layer and the dielectric layer or the platinum metal layer and the barrier layer of the semiconductor substrate.

8. The method of claim 6 wherein the polishing uses the polishing composition having abrasive particles present at a concentration from about 0.5% to about 55% by weight of the polishing composition; an organic compound up to about 10% by weight of the polishing composition; and an adjuvant up to about 50% by weight of the polishing composition wherein the adjuvant is selected from a group consisting of a metal-anion compound, a metal-cation compound or mixtures thereof.

9. The method of claim 8 wherein the polishing uses the adjuvant selected from the group consisting of salt of bismuth, zinc and gallium.

10. The method of claim 1 wherein the polishing uses the aqueous composition having an acid selected from the group consisting of citric acid, lactic acid, malic acid and tartaric acid.

* * * * *